(12) United States Patent
Simonis et al.

(10) Patent No.: US 12,196,817 B2
(45) Date of Patent: Jan. 14, 2025

(54) METHOD AND APPARATUS FOR PREDICTING A STATE OF HEALTH OF A DEVICE BATTERY IN A BATTERY-OPERATED DEVICE

(71) Applicant: Robert Bosch GmbH, Stuttgart (DE)

(72) Inventors: Christian Simonis, Leonberg (DE); Maurice Caspar, Wiesloch (DE); Stefan Schindler, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 171 days.

(21) Appl. No.: 17/537,791

(22) Filed: Nov. 30, 2021

(65) Prior Publication Data

US 2022/0170995 A1  Jun. 2, 2022

(30) Foreign Application Priority Data

Dec. 2, 2020 (DE) ..................... 10 2020 215 201.2

(51) Int. Cl.

| | |
|---|---|
| *G01R 31/392* | (2019.01) |
| *B60L 53/66* | (2019.01) |
| *B60L 58/13* | (2019.01) |
| *B60L 58/16* | (2019.01) |
| *G01R 31/382* | (2019.01) |

(52) U.S. Cl.
CPC ............ *G01R 31/392* (2019.01); *B60L 53/66* (2019.02); *B60L 58/13* (2019.02); *B60L 58/16* (2019.02); *G01R 31/382* (2019.01)

(58) Field of Classification Search
None
See application file for complete search history.

(56) References Cited

U.S. PATENT DOCUMENTS

| | | | |
|---|---|---|---|
| 2004/0162683 A1* | 8/2004 | Verbrugge | G01R 31/367 702/64 |
| 2013/0090900 A1 | 4/2013 | Gering | |
| 2014/0239900 A1* | 8/2014 | Abe | H01M 10/482 320/118 |

(Continued)

FOREIGN PATENT DOCUMENTS

| | | |
|---|---|---|
| DE | 10 2017 125 274 B3 | 3/2019 |
| KR | 10-2019-0043457 A | 4/2019 |

*Primary Examiner* — Nasima Monsur
(74) *Attorney, Agent, or Firm* — Maginot, Moore & Beck LLP

(57) ABSTRACT

A method for determining a state of health trajectory of a device battery is based on state of health values of device batteries of an identical battery type. The method includes providing time characteristics of operating variables of a multiplicity of device batteries of battery-operated machines in a central processing unit, and determining one or more state of health values of one or more of the multiplicity of device batteries by evaluating a respective characteristic of the operating variables within an evaluation period. The one or more state of health values with the applicable aging times each indicate a data point for the relevant device battery. The method further includes eliminating data points from the determined data points to obtain a set of cleaned-up data points, and ascertaining the state of health trajectory with an accuracy statement for each trajectory point based on the set of cleaned-up data points.

20 Claims, 3 Drawing Sheets

(56) References Cited

U.S. PATENT DOCUMENTS

| | | | |
|---|---|---|---|
| 2015/0256003 A1* | 9/2015 | Yonetani | B60L 58/16 |
| | | | 320/150 |
| 2016/0033582 A1* | 2/2016 | You | G01R 31/392 |
| | | | 324/426 |
| 2016/0109526 A1* | 4/2016 | Geffin | G01R 31/3648 |
| | | | 702/189 |
| 2017/0003352 A1* | 1/2017 | Barre | G01R 31/007 |
| 2018/0106868 A1 | 4/2018 | Sung | |
| 2018/0143257 A1* | 5/2018 | Garcia | G01R 31/382 |
| 2018/0348304 A1* | 12/2018 | Tang | G01R 31/3648 |
| 2020/0191876 A1 | 6/2020 | Shin et al. | |

\* cited by examiner

METHOD AND APPARATUS FOR PREDICTING A STATE OF HEALTH OF A DEVICE BATTERY IN A BATTERY-OPERATED DEVICE

This application claims priority under 35 U.S.C. § 119 to application no. DE 10 2020 215 201.2, filed on Dec. 2, 2020 in Germany, the disclosure of which is incorporated herein by reference in its entirety.

TECHNICAL FIELD

The disclosure relates to battery-operated machines, such as electrically driveable motor vehicles, in particular electric vehicles or hybrid vehicles, and moreover to measures for determining a state of health (SOH) of a device battery for a battery-operated machine.

BACKGROUND

Energy is supplied to battery-operated machines and devices, such as in particular electrically driveable motor vehicles, using a device battery, such as e.g. a vehicle battery. A device battery generally comprises one or more battery cells. It supplies electrical energy in order to operate machine systems. The state of health of the device battery deteriorates appreciably over the course of its life, resulting in a declining maximum storage capacity. An extent of the aging of the device battery is dependent on an individual loading of the device battery, that is to say on the usage behavior of a user, and on the type of device battery.

Although a physical aging model may be used to determine the present state of health based on historical operating variable characteristics, this model is often highly inaccurate. This inaccuracy of the conventional aging model hampers prediction of the state of health characteristic. However, the prediction of the characteristic of the state of health of the device battery is an important technical variable, since it allows a financial assessment of a residual value of the device battery.

Additionally, battery types that have not been extensively measured prior to startup have no state of health models available that can be used by the battery control unit to indicate a state of health. In particular, both details relating to the cell chemistry and the battery design, or the interconnection of the battery, are unknown and therefore the pure operating variables of the battery are the only reliable values that can be used to ascertain a state of health.

SUMMARY

According to the disclosure, there is provision for a method for determining a state of health trajectory of a device battery in a battery-operated machine, in particular an electrically driveable motor vehicle, and an apparatus and a battery-operated machine.

Further configurations are specified in the embodiments.

According to a first aspect, there is provision for a method for determining a state of health trajectory of a device battery based on states of health of a multiplicity of device batteries of an identical battery type in battery-operated machines, in particular in electrically driveable motor vehicles, having the following steps:

providing time characteristics of operating variables of the multiplicity of device batteries of battery-operated machines in a central processing unit;

determining one or more state of health values of one or more of the multiplicity of device batteries by evaluating a respective characteristic of the operating variables within an evaluation period, in particular during a charging and/or discharging process, wherein the one or more state of health values with the applicable aging times each indicate a data point for the relevant device battery;

eliminating data points from the determined data points by means of outlier elimination and/or on the basis of system and domain knowledge, in order to obtain a set of cleaned-up data points;

ascertaining the state of health trajectory with an accuracy statement for each trajectory point on the basis of the set of cleaned-up data points.

If the battery types of device batteries in battery-operated machines are unknown, it is sometimes not possible to ascertain or provide a statement relating to the state of health of the respective device battery outside the battery control unit. Only operating variables such as battery voltage, battery current, battery temperature and state of charge can be read in these cases. Although the respective state of health of a device battery can be determined by observing the battery behavior during a charging or discharging process, these methods are inaccurate and unsuitable for estimating a remaining life. Even when batteries are of known battery type, it is not possible to drop below accuracies of 5% in this manner, since said accuracies are substantially dependent on the use-related operating profile such as for example the variance of the state of charge, an average temperature range of battery operation and the like.

The use of fleet data of battery-operated machines with device batteries having unknown battery types is an even greater challenge for determining the state of health, since operating variables are influenced by different load profiles, user profiles and by series control of the device batteries.

The above method now provides for operating data of a multiplicity of device batteries of unknown battery type to be taken as a basis for carrying out, in a device-external central processing unit, an evaluation that can be used to determine the characteristic of the state of health for the relevant device battery type from an evaluation of time characteristics of operating variables for determining the state of health. The characteristic of the state of health, or of the state of health trajectory, can be accurately ascertained on the basis of the aging times of the device batteries even if the individual determination of the state of health values for the individual device batteries is itself inaccurate. Elimination of data points by means of outlier elimination and/or on the basis of system and domain knowledge allows data points that can adversely affect the modeling of the actual course of the state of health characteristic to be disregarded. In particular, statistical methods can be used to ascertain the mostly probable characteristic of the state of health for the device batteries of unknown type. The accuracy statement can be obtained for the different aging times in particular according to the law of large numbers.

The elimination of nonrepresentative or distorted observations on the basis of system and domain knowledge permits the relevant data points to be selected. It is thus possible for example to reject data points that have been captured during an undesirable operating state of the relevant device battery, such as e.g. in the event of an excessively high or excessively low temperature or in the event of too small a charge variance for ascertaining the state of health value based on the remaining capacity. The optimum criteria for selecting the data points, and the limit values of these criteria, can moreover be learned from a large number of data points of the multiplicity of device batteries over the course of the operating time and continually improved.

The state of health trajectory can be determined by means of fusion of the state of health values gradually when a sufficient number of data points are available. The advantage over the prior art is that the method makes it possible for even device batteries of unknown battery type, for which no electrochemical parameterization is available, to have their state of health assessed in a continually quantified manner and, to this end, uses both domain knowledge relating to the battery and data-based knowledge. The method also allows a continual improvement in the state of health trajectory for the purposes of the actual aging behavior as soon as new data points have been ascertained for the device batteries of the battery-operated machines in question.

Moreover, the state of health trajectory can be used to predict a time at which a determined state of health is reached, in particular an end of life of the device battery or a remaining life of the device battery, based on the state of health trajectory.

Alternatively or additionally, a specification value of a state of health of the device battery at a determined aging time can be compared against a state of health at the determined aging time that has been modeled using the state of health trajectory, wherein a deviation is continually observed and, in the event of a deviation of more than a predefined threshold value, signaled as an alarm or early warning. This allows predictive online monitoring of a specified aging value.

Moreover, all or part of the method can be performed in a device-external central processing unit communicatively connected to a multiplicity of battery-operated machines.

There can be provision for the time characteristics of the operating variables to be filtered and/or wherein outlier values of the time characteristics of the operating variables are eliminated before said operating variables are used to ascertain data points with states of health for a respective aging time.

There can be provision for the state of health trajectory to be modeled based on the cleaned-up data points by using at least one regression model, which is preferably fitted and evaluated in sections.

In particular, the trajectory points of the state of health trajectory can each be determined by selecting a predefined time period for aging times, wherein a model function of the regression model is fitted, or parameterized, to the cleaned-up data points within the time period, the model value being added to the model function at the aging time of the trajectory point to be determined of the state of health trajectory.

Moreover, the cleaned-up data points can each be assigned an accuracy statement, in particular by assessing the method for determining the applicable state of health value of the data point, e.g. by taking into consideration the ambient conditions (temperature sensitivity) and the use profile (such as charging variance), wherein an accuracy statement assigned to the state of health of the trajectory point to be determined is determined based on the accuracy statements of each of the cleaned-up data points taken into consideration within the time period by using an uncertainty quantification, in particular according to the law of large numbers.

There can be provision that, when determining the state of health value based on remaining capacity, the accuracy statement indicates a greater accuracy for the ascertained state of health value the higher the evaluated charge variance of the supplied or draining amount of charge (and the closer the ambient conditions to the technical definition of the state of health).

In particular, the state of health trajectory indicated by the state of health characteristic model can be predicted by using a nearest neighbor algorithm, using similarity conditions. Alternatively, linear or nonlinear extrapolations are also possible.

There can be provision for the data points to be cleaned up by
    adding to valid data points, within a predefined time period, the new data points ascertained in the most recently evaluated evaluation period with evaluation times within the applicable time period,
    fitting a parameterizable characteristic function to the valid and new data points,
    statically quantifying a deviation between the valid and new data points and the characteristic function in order to ascertain a standard deviation,
    adding new data points to the set of valid data points if they are within a confidence range defined by the standard deviation, or at least temporarily (until the next execution) rejecting said new data points if they are outside the range indicated by the standard deviation, wherein the updated valid data points correspond to the cleaned-up data points.

Moreover, the one or more state of health values of the one or more of the multiplicity of device batteries can be determined by using the observer or reference model by evaluating the respective characteristic of the operating variables within an evaluation period by means of Coulomb counting in order to determine a state of health value based on remaining capacity and/or by measuring a change in the internal resistance of the device battery in order to determine a state of health value based on an increase in the internal resistance.

Preferably, the temperature dependency during determination of the state of health value based on remaining capacity can be eliminated, e.g. in model-based fashion or by using a correction variable, determined by way of a family of characteristics, that is applied to the state of health value, preferably by multiplication or by addition.

Moreover, if the state of health value based on remaining capacity is ascertained in the battery-operated machine, the state of health value can be determined by using a state of charge that is at least partly dependent on a state of charge predefined by using a state of charge model implemented externally to the machine. The state of charge model implemented externally to the machine is created and adapted based on data of the multiplicity of device batteries. The state of health value based on a measurement or observation of the remaining capacity is formed by a quotient of a current integral and a state of charge difference during charging or discharge.

According to a further aspect, there is provision for an apparatus, in particular of a central processing unit communicatively connected to a multiplicity of battery-operated machines, for determining a state of health trajectory of a device battery based on state of health values of the multiplicity of device batteries of an identical battery type in the battery-operated machines, in particular in electrically driveable motor vehicles, wherein the apparatus is designed to:
    receive time characteristics of operating variables of the multiplicity of device batteries of battery-operated machines in a central processing unit;
    determine one or more state of health values of one or more of the multiplicity of device batteries by evaluating a respective characteristic of the operating variables within an evaluation period, in particular during a charging and/or discharging process, wherein the one or more state of health values with the applicable aging times each indicate a data point for the relevant device battery;

eliminate data points from the determined data points by means of outlier elimination and/or on the basis of system and domain knowledge, in order to obtain a set of cleaned-up data points;

ascertain the state of health trajectory with an accuracy statement for each trajectory point on the basis of the set of cleaned-up data points.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as device batteries in a motor vehicle as battery-operated device or battery-operated machine. This example is representative of a multiplicity of stationary or mobile battery-operated machines and devices with a mains-independent energy supply, such as for example vehicles (electric vehicles, pedelecs, etc.), installations, machine tools, domestic appliances, IOT devices, a building energy supply, aircraft, in particular drones, autonomous robots and consumer electronics devices, in particular cell phones, and the like, that are connected to a central processing unit (cloud) by way of an appropriate communication connection (e.g. LAN, Internet).

Figure 1:
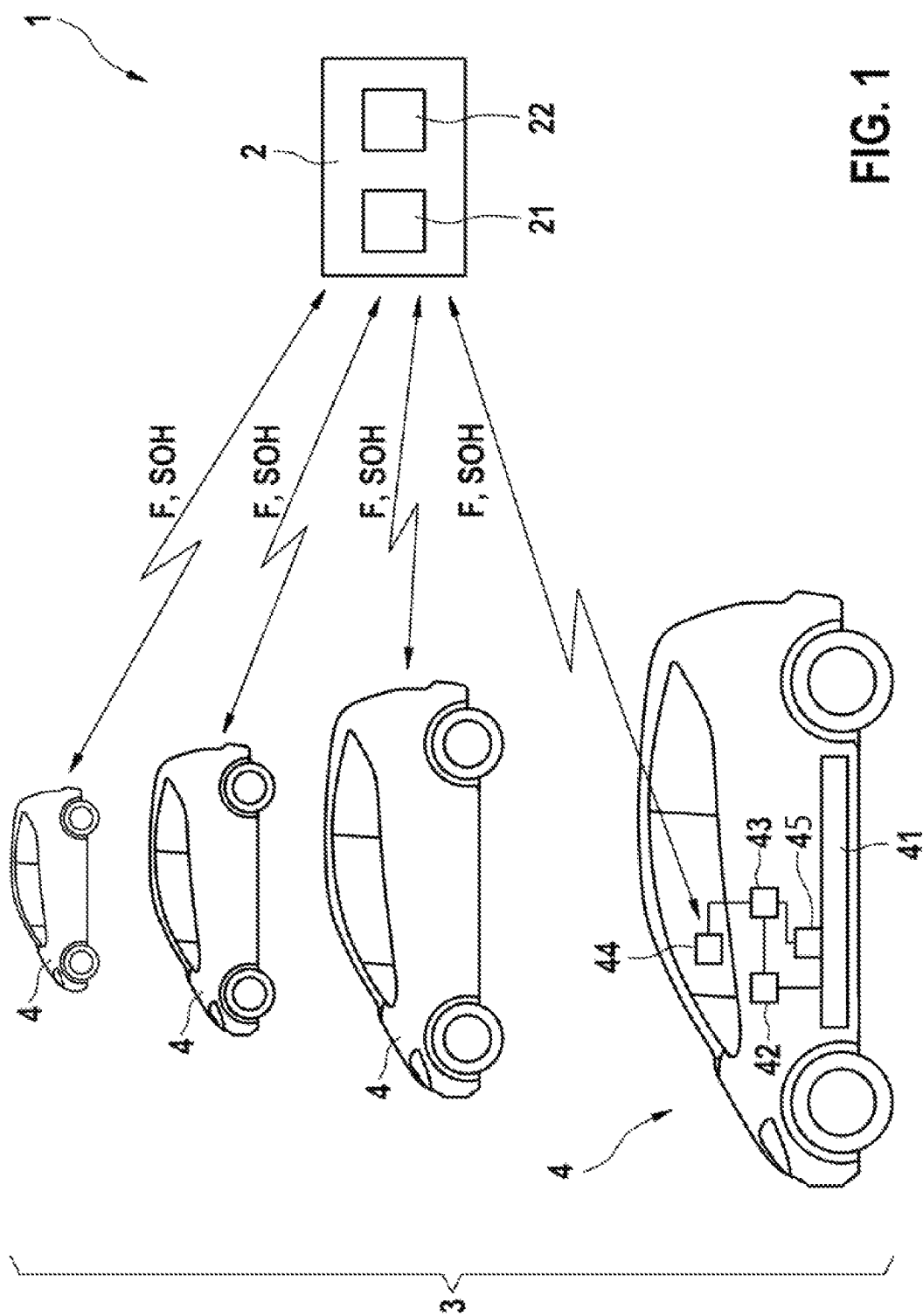
FIG. 1 shows a schematic depiction of a system for providing driver-individual and vehicle-individual operating variables with regard to the operation of a vehicle battery of vehicles of a vehicle fleet to a central processing unit.

FIG. 1 shows a system 1 for collecting fleet data in a central processing unit 2 for the purpose of creating and operating and also evaluating a state of health model, which is in the form of a reference or observer model. The reference or observer model is used for determining a state of health value for the vehicle battery in a motor vehicle. The reference or observer model can be implemented both in the motor vehicle 4 or close to the technical (IOT) device, or alternatively in the central processing unit 2.

FIG. 1 shows a vehicle fleet 3 with multiple motor vehicles 4. A state of health trajectory for the vehicle batteries of motor vehicles 4 of the vehicle fleet 3 is intended to be determined in the central processing unit 2 based on the fleet data.

One of the motor vehicles 4 is shown in more detail in FIG. 1. The motor vehicles 4 each have a vehicle battery 41 as device battery, an electric drive motor 42 and a control unit 43. The control unit 43 is connected to a communication module 44 that is suitable for transferring data between the respective motor vehicle 4 and the central processing unit 2 (a so-called cloud). The control unit 43 is connected to a sensor unit 45 that has one or more sensors in order to continuously capture operating variables.

The motor vehicles 4 transmit the operating variables F, which at least indicate variables that influence the state of health of the vehicle battery or that can be used to determine said state of health, to the central processing unit 2. In the case of a vehicle battery 41, the operating variables F may indicate a present battery current, a present battery voltage, a present battery temperature and a present state of charge (SOC), at pack, module and/or cell level alike. The operating variables F are captured in a fast time frame of between 0.1 Hz and 100 Hz according to signal type, and may be transferred to the central processing unit 2 in uncompressed and/or compressed form on a regular basis. By way of example, the time series may be transferred to the central processing unit 2 in blocks at intervals of between 10 min and several hours.

The central processing unit 2 has a data processing unit 21, in which the method described below is able to be performed, and a database 22 for storing states of health with the respective associated aging times of the vehicle batteries 41 of a multiplicity of vehicles 4 of the vehicle fleet 3.

The state of health (SOH) is the key variable for indicating a remaining battery capacity or remaining battery charge. The state of health is a measure of the aging of the vehicle battery or of a battery module or of a battery cell and can be indicated as a remaining capacity (SOH-C) or as a rise in internal resistance (SOH-R). The state of health based on remaining capacity (SOH-C) is indicated as the ratio of the measured present capacity to an initial capacity of the fully charged battery. The relative change in internal resistance SOH-R rises as the battery ages.

A state of health trajectory is intended to be ascertained in the central processing unit 2 by using a method that is in particular wholly or partly data-based. The state of health trajectory is intended to characterize the vehicle battery of unknown battery type in order to be able to indicate or predict a state of health for aging times of each of the vehicle batteries. State of health values for the vehicle batteries of unknown battery type are ascertained based on the time characteristics of the applicable operating variables by evaluating the battery behavior during a charging and/or discharging process, such as for example by means of the Coulomb counting method, which is known per se. In this regard, unknown relates to the electrochemical properties and parameters of the energy store.

The state of health value is assigned to the aging time of the relevant vehicle battery 41, and in this way a data point for creating a state of health characteristic model is determined.

Figure 2:
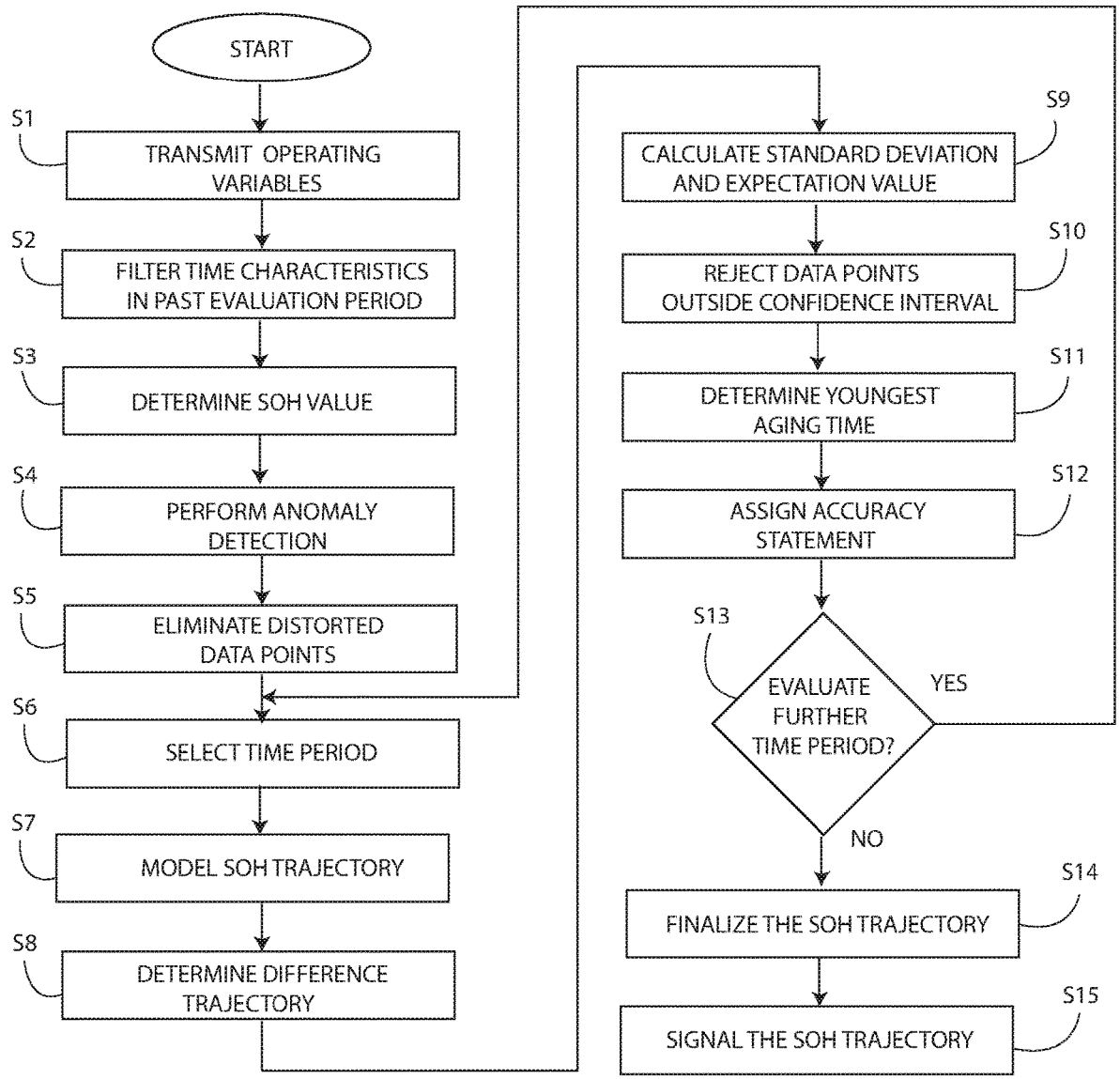
FIG. 2 shows a flowchart to illustrate a method for ascertaining a state of health trajectory for a vehicle battery in a motor vehicle of unknown battery type.

FIG. 2 shows a flowchart to illustrate a method for ascertaining a state of health trajectory in the central processing unit 2. The state of health trajectory determines a vehicle-individual, real (most probable) characteristic of the aging of vehicle batteries of the same battery type as well as the associated characteristic of a confidence interval in order to determine the accuracy of the model value of the state of health trajectory.

In step S1, the vehicles 4 of the vehicle fleet 3 transmit operating variables F, as described above, to the central processing unit 2 at regular intervals of time. Time characteristics of the operating variables F for a multiplicity of vehicle batteries 41 are therefore available in the central processing unit 2 for evaluation. The evaluations take place on a regular basis according to predefined evaluation periods, which means that already evaluated time characteristics of the operating variables F are not evaluated repeatedly, provided that there is no new information available in the relevant evaluation periods. A customary value for the evaluation period is one week.

In step S2, the time characteristics of the operating variables F in the past evaluation period are filtered for each of the vehicle batteries 41. In particular, the time characteristics of the operating variables F can be checked for whether measurement outliers are present. The time characteristics can also be filtered in order to eliminate measurement outliers. This data conditioning of the operating variables is used to filter out brief measurement errors that arise e.g. on account of an interference effect (EMC) in order to improve the quality of a subsequent determination of the state of health value. Possible filter methods are low-pass filters, smoothing methods or the like and suitable outlier elimination methods.

By way of example, a plausibility check takes place in rule-based fashion on domain knowledge (e.g. the SOC cannot decrease if the current is positive). Moreover, a comparison and an assessment can take place using previous, typical state variables and usage patterns, in order to carry out an anomaly assessment. Sigma clipping can also be used to assess or correct the residual if a limit value is exceeded, in particular after a trend function has been removed e.g. using a nonlinear functional (for example using an ARIMA model). This leads to smoothing of the time characteristics of the operating variables, because outliers are cleaned up. It is also subsequently possible to use a PT1 element or a Butterworth filter for signal-oriented smoothing of the characteristics.

In step S3, the time series are taken as a basis for determining the state of health value according to a reference or observer model. Said reference or observer model provides for using observation or measurement of the operating variables to determine the state of health value based on remaining capacity (SOH-C) or as a change in internal resistance based on the reference value at beginning of life or startup (SOH-R).

By way of example, a state of health value based on remaining capacity (SOH-C) can be determined based on a Coulomb counting method. This is accomplished by using the time characteristics of the operating variables to detect that a charging process is carried out. The charging process can be detected for example on the basis of a status signal (vehicle status signal) or if a constant current is supplied from a state of complete discharge or a sufficiently low state of charge of the vehicle battery 41 (this can be detected if a discharge finishing voltage has been reached). The charging process can therefore be detected on the basis of a positive flow of current to the vehicle battery 41. If the charging process has taken place as far as full charging, it is possible to determine the total amount of charge supplied to the vehicle battery by integrating the flow of current to the vehicle battery. This maximum amount of charge can be assigned to a state of health value by comparing it with a nominal charging capacity of the vehicle battery 41. It is also possible to evaluate partial charges with a specific supply of charge and appropriate measurements of the cell voltages before and after the partial charging in order to determine the state of health value based on remaining capacity.

Moreover, the Coulomb counting can also be carried out for discharging processes, for example during a driving cycle, by determining a draining amount of charge and evaluating the cell voltages before and after the partial charging. If a state of health value SOH-C determined by the remaining capacity is determined in this manner, said state of health value is assigned a timestamp that corresponds to an aging time of the relevant vehicle battery, in order to form an applicable data point.

Alternatively, a state of health value can also be determined as an internal-resistance-based state of health SOH-R. In this case, a $\Delta U/\Delta I$ is determined at the beginning of the charging process as the quotient of the change in battery voltage to the change in battery current, and said quotient is assigned a state of health SOH-R in a manner that is known per se. The state of health value ascertained in this manner can be assigned to the aging time of the relevant vehicle battery 41 in order to form an applicable data point.

Both the state of health values SOH-C based on remaining capacity and the state of health values SOH-R based on the change in internal resistance can accordingly be used for all vehicle batteries, together or separately, as new data points for determining the state of health trajectory. Moreover, both for SOHC and for SOHR, each state of health value is assigned a measurement or observation confidence by using the analysis of the usage behavior, such as charge variance during the measurement, and ambient conditions, such as temperature during the measurement.

Preferably, the temperature dependency during determination of the state of health value based on remaining capacity can be eliminated, e.g. by using a correction variable, determined by way of a family of characteristics, that is applied to the state of health values. That is to say that, while the Coulomb counting method is proceeding, a representative battery temperature is measured and said battery temperature is assigned the correction variable. The ascertained state of health value then has the correction variable applied to it, for example by multiplication or addition.

Moreover, if the state of health values based on remaining capacity are ascertained in the battery-operated machine, the state of health values can be determined by using a state of charge that is at least partly dependent on a state of charge predefined by using a state of charge model implemented externally to the machine. It is thus possible for the state of charge ascertained by a battery control unit to be plausibility-checked using the state of charge of the state of charge model implemented externally to the machine. Alternatively, both states of charge can be fused, depending on the confidence of the SOC model. The state of charge model implemented externally to the machine is created and adapted based on data of the multiplicity of device batteries. The state of health values based on remaining capacity are formed by a quotient of a current integral and a state of charge difference during charging or discharge.

In step S4, an anomaly detection can be used to eliminate anomalous data points for the state of health values in the most recently evaluated evaluation period. The anomaly detection takes valid data points, i.e. data points classified as normal in earlier evaluation periods, as a basis for assessing each new data point for whether it is normal or anomalous. The new data points correspond to the data points ascertained from the time characteristics of the operating variables in the present or past evaluation period. The anomaly detection thus allows state of health values (data points) detected as anomalous to be eliminated from the set of data points determined in the most recently evaluated evaluation period. State of health values that were assessed as an anomaly at a previous time in the algorithm execution can also be classified as normal again (and vice versa) at a new time if new information is available.

In step S5, data points that turn out to be nonrepresentative or distorted on the basis of system and domains are eliminated. E.g. it is possible to remove data points that have been ascertained after a period since the last balancing process that is above a threshold period. It is also possible to disregard data points if the data point has been captured under a nonrepresentative condition, such as e.g. ambient conditions. By way of example, a charging process must take place within a defined temperature window. This permits the relevant data points to be selected. The optimum criteria and the limit values thereof for the conditions can be learned from large sets of fleet data.

It is alternatively also possible for just one of method steps S4 and S5 to be performed, or in the opposite order. The data points that are not rejected in steps S4 and/or S5 are subsequently provided as cleaned-up data points.

To determine the state of health trajectory, a time period for selecting each of the aging times (data points) is selected in step S6. The length of the respective time period is based on the state of health characteristic. By way of example, gradient monitoring can be used to select the time period, the time period being selected on the basis of the gradient that results from a trajectory of the state of health within the relevant time period. E.g. this time period is short if the gradient is high, in order to counteract a filter inertia, and vice versa. The time period for conventional device batteries can be selected based on domain knowledge and expected degradation, such as e.g. between 1 month and 3 months, preferably 2 months.

The state of health trajectory can then be modeled beginning with step S7 by using at least one regression model based on possibly already existing data points and the cleaned-up new data points. The regression model can be predefined by a parameterizable linear or nonlinear model function. This model function is fitted to all possibly already existing data points and cleaned-up data points of the state of health trajectory within the selected time period by adapting the parameters of the model function such that said model function reproduces the characteristic of the state of health trajectory, or the data points contained therein, with minimal or minimized deviation.

In step S8, a difference trajectory, in the form of a residual, between the model values of the model function and the cleaned-up data points within the selected time period is determined. This is done by using the residual from S7 after the fitting.

In step S9, the standard deviation and the expectation value of the difference trajectory are calculated. This is preferably carried out by ascertaining the deviation of each data point from the model function and preferably assuming a normal distribution of the deviations. It is alternatively also possible to consider any, in particular even nonparametric, probability distributions. It is therefore possible for a confidence quantile, e.g. a 90% quantile, to be determined in S9.

In step S10, all new data points situated outside the confidence interval defined by the standard deviation determined in step S9, or a confidence quantile in general, are rejected. The remaining new data points are added to the already existing data points and subsequently referred to as cleaned-up data points. Data points that were rejected for a previous algorithm execution can be used to update the state of health trajectory in a fresh pass of the method at a later time, if they are within the defined confidence band in the fresh pass, if new data points, such as e.g. new state of health values, are available.

In step S11, the youngest aging time (i.e. the "older" end of the model function) of the time period is then determined as the model value of the parameterized model function as a trajectory point. Alternatively, the model function can be fitted again if new data points have been rejected in step S10.

The state of health is therefore projected (without filter lag) onto the present state of health of the trajectory point using the regression model. Selection of different time periods, in particular at regular aging times since startup of the vehicle batteries, results in a smoothed state of health trajectory that is determined by the trajectory points ascertained as described above.

An accuracy statement can be assigned to an added trajectory point in step S12. The cleaned-up data points can also be provided with accuracy statements obtained from the residual calculated in S8 in view of the method for determining the applicable state of health value of the data point. An accuracy statement assigned to the state of health of the trajectory point to be determined is also determined based on the accuracy statements of each of the cleaned-up data points taken into consideration within the time period by using an uncertainty quantification, in particular according to the law of large numbers. By way of example, when determining the state of health value based on remaining capacity, the accuracy statement can indicate a greater accuracy for the ascertained state of health value the higher the evaluated charge variance of the supplied or draining amount of charge.

The accuracy $\sigma_{trajectory}$ of the trajectory point can then be determined according to the law of large numbers by means of $$\sigma_{trajectory} = \frac{\sigma}{\sqrt{n}},$$

where n corresponds to the number of data points of a cluster and a corresponds to the identical accuracy of the data point. The assumption in this regard is that all data points have the same confidence. However, it is also possible for data points having different confidences to be taken into consideration using weighting methods, wherein data points having greater uncertainty are given a lower weighting and data points having lesser uncertainty are given a higher weighting, in order to ascertain a resultant uncertainty in the form of a standard deviation at the present time of the state of health trajectory (i.e. the "older" end of the model function).

In step S13, a check is performed to determine whether further time periods are intended to be evaluated in order to ascertain a trajectory point. If this is the case (alternative: Yes), the method continues with step S6. Otherwise (alternative: No), the method continues with step S14.

Selection of different time periods, in particular at regular aging times since startup of the vehicle batteries, results in a state of health trajectory that is determined by the trajectory points ascertained as described above.

Figure 3:
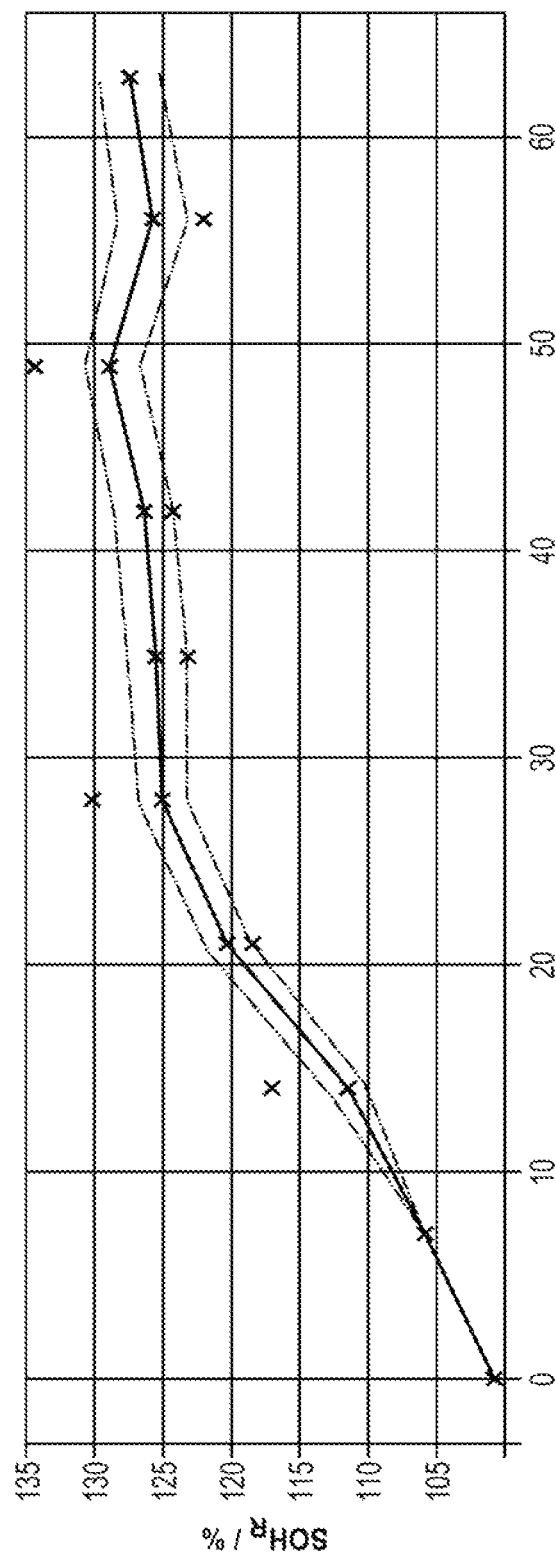
FIG. 3 shows a depiction of a state of health trajectory for illustrative data points with a characteristic of the accuracy statement in the form of a confidence interval assigned to the aging trajectory.

FIG. 3 depicts an illustrative time characteristic (in days) of a smoothed state of health trajectory comprising the cleaned-up data points (depicted as crosses) of the states of health SOHR [%] with a respective confidence interval (dash-dot lines).

Alternatively, the data points can also be used to train a data-based regression model, such as e.g. a Gaussian process model, that provides the state of health trajectory as an expectation value and the accuracy of the trajectory point as a model inaccuracy.

In step S15, the state of health trajectory can then be signaled and used for downstream functions, such as for example for determining the remaining life, predicting the state of health and the like. The accuracy statement can be used to assist proactive guarantee and TCO management of the battery system. Since a vehicle value is substantially dependent on the state of health of the vehicle battery 41, the accuracy statement can be used to carry out improved residual value estimation.

Moreover, the accuracy statement can be used to make cross-battery statements relating to the system behavior. E.g. as a measure of series variation for individual battery cells in the pack. In view of the balancing strategy, very small confidence intervals indicate e.g. that the cells in the pack are aging in comparable fashion. Suddenly increasing confidence intervals can provide an indication of the operating strategy in the vehicle (such as earlier derating in the BMS) or of anomalies.

The data points can be used as a whole or taken into consideration following classification according to the operating category of the vehicle battery. It is thus possible for the data points to be used separately for ascertaining the aging trajectory and the associated accuracy information, according to the degree of loading on the vehicle battery, e.g. measured as average Ah throughput, kilometers traveled or the like.

What is claimed is:

1. A method, which is computer-implemented, for determining a state of health trajectory of a selected device battery based on state of health values of a plurality of device batteries of an identical battery type in battery-operated machines, the plurality of device batteries including the selected device battery and other device batteries, the method comprising:
    providing, in a central processor, time characteristics of operating variables of the plurality of device batteries;
    implementing, in the central processor, a state of charge model and adapting the state of charge model based on data points from the other device batteries of the plurality of device batteries;
    determining state of health values of the selected device battery of the plurality of device batteries for determining the state of health trajectory by evaluating (i) the state of charge model, and (ii) a respective time characteristic of the operating variables within an evaluation period, each of the state of health values within applicable aging times indicating a data point for the selected device battery;
    obtaining a set of cleaned-up data points by eliminating data points from the data points indicated by the state of health values, at least one of (i) using an outlier elimination according to criteria, and (ii) based on system and domain knowledge according to the criteria;
    ascertaining the state of health trajectory of the selected device battery with an accuracy statement for each trajectory point based on the set of cleaned-up data points;
    predicting an end of life time of the selected device battery based on the ascertained state of health trajectory; and
    operating the selected device battery based on the predicted end of life time,
    wherein the criteria for obtaining the set of cleaned-up data points and eliminating the data points are based on the data points from the other batteries of the plurality of device batteries,
    wherein the state of health is a measure of an aging of the selected device battery, and
    wherein the state of health trajectory is configured to indicate or predict the state of health of the selected device battery based on an input aging time.

2. The method according to claim 1, further comprising:
    predicting, based on the state of health trajectory, a time at which a determined state of health is reached.

3. The method according to claim 1, wherein at least one of (i) the providing the time characteristics, (ii) the determining the state of health values, (iii) the obtaining the set of cleaned-up data points, and (iv) the ascertaining the state of health trajectory, is performed by the central processor, the central processor being a device-external central processor that is communicatively connected to at least some of the battery-operated machines.

4. The method according to claim 1, further comprising:
    before using the operating variables to ascertain data points with state of health values for a respective aging time, at least one of:
        filtering the time characteristics of the operating variables; and
        eliminating outlier values of the time characteristics of the operating variables using a predefined outlier elimination method.

5. The method according to claim 1, the ascertaining the state of health trajectory further comprising:
    modelling the state of health trajectory based on the cleaned-up data points using at least one regression model.

6. The method according to claim 5, the ascertaining the state of health trajectory further comprising:
    determining each respective trajectory point of the state of health trajectory by:
    selecting a predefined time period for a respective aging time; and
        one of (i) fitting and (ii) parameterizing a model function of at least one regression model to the cleaned-up data points within the predefined time period, a model value being added to the model function at the respective aging time of the respective trajectory point.

7. The method according to claim 6, further comprising:
    creating the model function using only those data points of the cleaned-up data points within the predefined time period that are situated within a confidence interval around the model function, the confidence interval being determined by a standard deviation that is obtained from the residuals of the cleaned-up data points based on a characteristic of the model function.

8. The method according to claim 6, further comprising:
    assigning, to each respective cleaned-up data point of the cleaned-up data points, a respective accuracy statement; and
    assigning an accuracy statement to the state of health of a trajectory point based on the respective accuracy statement of each of the cleaned-up data points taken into consideration within the predefined time period by using an uncertainty quantification.

9. The method according to claim 8, wherein, when determining a state of health based on remaining capacity, the accuracy statement indicates a greater accuracy for the determined state of health with a higher evaluated charge variance of one of (i) a supplied amount of charge and (ii) a draining amount of charge.

10. The method according to claim 1, the ascertaining the state of health trajectory further comprising:
    predicting the state of health trajectory using a nearest neighbor algorithm.

11. The method according to claim 1, the obtaining the set of cleaned-up data points further comprising:

ascertaining new data points, within a predefined time period, the new data points being ascertained in a most recently evaluated evaluation period with evaluation times within an applicable time period;

fitting a parameterizable model function to the data points indicated by the state of health values and the new data points;

ascertaining a standard deviation by statically quantifying a deviation between (i) the model function and (ii) the data points indicated by the state of health values and the new data points; and one of (i) adding the new data points to cleaned-up data points in response to the new data points being within a range indicated by the standard deviation, and (ii) rejecting the new data points in response to the new data points being outside the range indicated by the standard deviation.

12. The method according to claim 1, determining the state of health values of the selected device battery further comprising:

evaluating the respective characteristic of the operating variables within the evaluation period by at least one of (i) using Coulomb counting to determine a state of health value based on a remaining capacity, and (ii) measuring a change in an internal resistance of the selected device battery to determine a state of health value based on the change of internal resistance.

13. The method according to claim 1, wherein a computer program has instructions that are executed by at least one data processing device to cause the at least one data processing device to carry out the method.

14. The method according to claim 1, wherein the battery-operated machines comprise electrically driveable motor vehicles.

15. The method according to claim 1, wherein the evaluation period is one of a charging process and a discharging process.

16. The method according to claim 2, wherein the determined state of health is one of (i) an end of life of the selected device battery, and (ii) a remaining life of the selected device battery.

17. The method according to claim 8, the assigning, to each respective cleaned-up data point of the cleaned-up data points, the respective accuracy statement further comprising:

assessing a method for determining an applicable state of health value of the respective cleaned-up data point.

18. The method according to claim 1, wherein the device batteries of the plurality of device batteries are of an unknown battery type to the central processor when the central processor determines the state of health values and ascertains the state of health trajectory.

19. An apparatus of a central processor, which is communicatively connected to a plurality of battery-operated machines, for determining a state of health trajectory of a selected device battery based on state of health values, which are one of observed and determined, of a plurality of device batteries of an identical battery type in battery-operated machines, the plurality of device batteries including the selected device battery and other device batteries, the apparatus being configured to:

receive, in the central processor, time characteristics of operating variables of the plurality of device batteries;

implement, in the central processor, a state of charge model and adapt the state of charge model based on data points from the other device batteries of the plurality of device batteries;

determine state of health values of the selected device battery of the plurality of device batteries for determining the state of health trajectory by evaluating (i) the state of charge model, and (ii) a respective characteristic of the operating variables within an evaluation period, each of the state of health values within applicable aging times indicating a data point for the selected device battery;

obtain a set of cleaned-up data points by eliminating data points from the data points indicated by the state of health values, at least one of (i) using an outlier elimination according to criteria, and (ii) based on system and domain knowledge according to the criteria;

ascertain the state of health trajectory of the selected device battery with an accuracy statement for each trajectory point based on the set of cleaned-up data points;

predict an end of life time of the selected device battery based on the ascertained state of health trajectory; and operate the selected device battery based on the predicted end of life time, wherein the criteria for obtaining the set of cleaned-up data points and eliminating the data points are based on the data points from the other batteries of the plurality of device batteries, wherein the state of health is a measure of an aging of the selected device battery, and wherein the state of health trajectory is configured to indicate or predict the state of health of the selected device battery based on an input aging time.

20. A non-transitory machine-readable storage medium for determining a state of health trajectory of a selected device battery based on state of health values, which are one of observed and determined, of a plurality of device batteries of an identical battery type in battery-operated machines, the plurality of device batteries including the selected device battery and other device batteries, the non-transitory machine-readable storage medium storing instructions of a computer program that, when executed by at least one data processing device, cause the at least one data processing device to:

receive, in the central processor, time characteristics of operating variables of the plurality of device batteries;

implement, in the central processor, a state of charge model and adapt the state of charge model based on data points from the plurality of device batteries;

determine state of health values of the selected device battery of the plurality of device batteries for determining the state of health trajectory by evaluating (i) the state of charge model, and (ii) a respective characteristic of the operating variables within an evaluation period, each of the state of health values within applicable aging times indicating a data point for the selected device battery;

obtain a set of cleaned-up data points by eliminating data points from the data points indicated by the state of health values, at least one of (i) using an outlier elimination according to criteria, and (ii) based on system and domain knowledge according to the criteria;

ascertain the state of health trajectory of the selected device battery with an accuracy statement for each trajectory point based on the set of cleaned-up data points;

predict an end of life time of the selected device battery based on the ascertained state of health trajectory; and operate the selected device battery based on the predicted end of life time,
wherein the criteria for obtaining the set of cleaned-up data points and eliminating the data points are based on the data points from the other batteries of the plurality of device batteries,
wherein the state of health is a measure of an aging of the selected device battery, and
wherein the state of health trajectory is configured to indicate or predict the state of health of the selected device battery based on an input aging time.

* * * * *